United States Patent [19]

Schneider et al.

[11] Patent Number: 5,610,442
[45] Date of Patent: Mar. 11, 1997

[54] SEMICONDUCTOR DEVICE PACKAGE FABRICATION METHOD AND APPARATUS

[75] Inventors: Mark R. Schneider, San Jose; Robert T. Trabucco, Los Altos, both of Calif.

[73] Assignee: LSI Logic Corporation, Milpitas, Calif.

[21] Appl. No.: 412,087

[22] Filed: Mar. 27, 1995

[51] Int. Cl.$^6$ .................... H01L 23/28; H01L 23/10; H01L 23/48
[52] U.S. Cl. .................... 257/787; 257/777; 257/778; 257/706
[58] Field of Search .................... 257/787, 777, 257/778, 796, 675, 696, 700, 705, 695, 685, 706, 686, 704, 633, 434

[56] References Cited

U.S. PATENT DOCUMENTS

| 4,092,697 | 5/1978 | Spaight | 257/706 |
|---|---|---|---|
| 5,157,478 | 10/1992 | Ueda et al. | 257/675 |
| 5,357,672 | 10/1994 | Newman | 29/830 |
| 5,438,478 | 8/1995 | Kondo et al. | 257/796 |
| 5,455,457 | 10/1995 | Kurokawa | 257/706 |

FOREIGN PATENT DOCUMENTS

| 0848180A1 | 5/1992 | European Pat. Off. | 257/706 |
|---|---|---|---|
| 62-145751 | 6/1987 | Japan | 257/787 |
| 6-132425 | 5/1994 | Japan | 257/706 |

OTHER PUBLICATIONS

"Electronic Packaging & Interconnection Handbook", pp. 7.24–7.27, C. Harper.

*Primary Examiner*—Mahshid D. Saadat
*Assistant Examiner*—Jhihan B. Clark
*Attorney, Agent, or Firm*—Katz & Cotton, LLP

[57] ABSTRACT

A planar substrate is attached to a face of a semiconductor die. The semiconductor die is electrically connected to a printed wiring board and encapsulation material covers the peripheral edges of the planar substrate, semiconductor die, and means for interconnecting the die and printed wiring board. An exterior face of the planar substrate remains exposed and may be utilized in pick and place automatic assembly. The exterior face of the planar substrate may also be utilized for attachment of an external heat sink for improved heat transfer from the semiconductor device. The planar substrate may be comprised of silicon, ceramic, metal or any other stiff material so long as the temperature coefficient of expansion is similar to that of the semiconductor die. A flip-chip semiconductor die may also be utilized without a planar substrate wherein the nonactive face of the die is exposed.

26 Claims, 5 Drawing Sheets

SEMICONDUCTOR DEVICE PACKAGE FABRICATION METHOD AND APPARATUS

BACKGROUND OF THE INVENTION

1. Field of Invention

This invention relates to a method and apparatus for fabricating semiconductor device packages, more particularly, to attaching a thermally conductive stiffener proximate to a face of the semiconductor device for reducing warpage of the semiconductor package, and for improved thermal transfer of heat from the semiconductor device in the package.

2. Discussion of the Related Art

Packaging techniques for integrated circuits have been developed in an attempt to satisfy demands for miniaturization in the semiconductor industry. Improved methods for miniaturization of integrated circuits enabling the integration of millions of transistor circuit elements onto a single integrated circuit semiconductor die, have resulted in increased emphasis on methods to package the semiconductor die in a reliable and mass producible package.

Two related types of integrated circuit packages are the plastic pin grid array ("PPGA") and the plastic ball grid array ("PBGA"). The PPGA and PBGA packages are particularly adapted to have a large number of external connections through either metal pins or solder balls, respectively. The PPGA and PBGA packages are fabricated from printed wiring boards ("PWB") that may have one or more layers of conductive traces or leads arranged in patterns that facilitate interconnection of the semiconductor die circuit connection pads to the external connection pins or solder balls. PPGA and PBGA packages are more fully illustrated in commonly owned U.S. Pat. No. 5,357,672, by Newman, issued Oct. 25, 1994; and U.S. patent application Ser. No. 08/142,251, by Barber, filed Oct. 22, 1993, both incorporated by reference herein for all purposes.

The semiconductor die is placed onto a face of the PWB and connections, for example wirebonds, are made between the die connection pads and the conductive traces of the PWB. A dam ring is typically placed around the semiconductor die, and encapsulation material, for example "HYSOL" (trademark of Dexter Electronics, Inc.), in its uncured liquid state is poured over the semiconductor die and connections within the dam ring. The encapsulation material is cured, and an aluminum or other type of metal lid is placed over the cured encapsulation and dam ring to form a cover and flat surface.

The flat surfaced lid is necessary for the package to be compatible with the pick and place automatic insertion equipment that is used to assemble integrated circuit packages onto electronic system printed circuit boards. In addition, the metal lid provides thermal heat transfer from the active circuit heat generating semiconductor die to the air surrounding the package or to a heat sink attached to the lid.

A sufficient volume and quantity of encapsulation material poured onto the PWB must be used to fully cover the bond wires, semiconductor die, and to occupy the space between the dam ring and under the lid. The encapsulation material while curing, however, tends to shrink. This curing shrinkage, because of the amount of encapsulation material on the PWB, may cause the PWB to warp excessively. Excessive warpage of the PWB renders the package difficult or unfit for assembly, especially for automatic assembly with a planar system printed circuit board.

What is needed is a method and system for fabricating simple and inexpensive integrated circuit packages with a minimum amount of encapsulation material necessary, and with a flat outer surface compatible with automated pick and place assembly equipment.

SUMMARY OF THE INVENTION

It is therefore an object of the present invention to provide a method and system for fabricating simple and inexpensive integrated circuit packages with a minimum amount of encapsulation material necessary, and with a flat outer surface compatible with automated pick and place assembly equipment.

It is a further object of the present invention to do away with the encapsulation dam ring and metal lid for PPGA and PBGA packages.

Yet another object of the present invention is to utilize the heretofore electrically defective semiconductor scrap wafers as package stiffeners and flat surfaces for pick and place equipment.

A further object of the present invention is to utilize an inexpensive package stiffener having substantially the same thermal coefficient of expansion as a semiconductor die.

Still another object of the present invention is an efficient means of transferring heat from an encapsulated semiconductor die mounted on a PWB package.

Yet another object of the present invention is to utilize a thermally conductive material in close thermal communication with a semiconductor die and adapted for attachment to a heat sink for improved thermal heat dissipation.

According to an embodiment of the present invention, a semiconductor die is electrically connected to a PWB, and a planar silicon substrate is attached to a face of the die opposite the PWB. The planar silicon substrate is proximate to the active face of the die and is in thermal communication therewith. The planar silicon substrate may be attached to the die with any type of adhesive that is electrically non-conductive and thermally conductive. This adhesive may be the same encapsulation material used for encapsulating the semiconductor die and planar silicon substrate on the PWB. The adhesive may also be any type of adhesive, such as epoxy, that is used in fabricating semiconductor devices. Those skilled in the art of semiconductor and integrated circuit package fabrication would be aware of preferable ways to attach a planar substrate to a face of a semiconductor die.

A planar substrate made of ceramic or metal (copper, aluminum, etc.) may also be utilized. When the planar substrate does not have the same TCE as the active semiconductor die, a compliant adhesive may be used to relieve shear stress caused by dissimilar thermal expansion of the semiconductor die and the planar substrate. The adhesive between the die and substrate may be filled with a thermally conductive and electrically insulated material such as, for example, fused quartz (silica). A thermally filled adhesive need not be extremely thin for good thermal conduction.

The present invention eliminates the need to use excessive amounts of encapsulation material, thus substantially eliminating the problem of PWB warpage during curing of the encapsulation material. In addition, the dam ring and planar metal lid are eliminated.

According to a preferred embodiment of the invention, a planar silicon substrate is attached to the face of an active semiconductor die with "HYSOL" encapsulant. The die and substrate are placed onto a PWB where the die bond pads are wirebonded to the PWB conductive traces. Tape automated bonding ("TAB") and flip-chip solder ball connections are also contemplated and encompassed in the scope of the present invention.

After the wirebond connections are made between the die bond pads and the PWB conductive traces, "HYSOL" encapsulation material is applied along the periphery edges of the die and substrate, and the adjacent surface of the PWB in an amount sufficient only to adequately cover the wirebond bond wires. By substantially reducing the amount of encapsulation material used, there is not a enough encapsulant material to cause the PWB to warp as the encapsulation cures. Also the planar silicon substrate helps to "stiffen" the PWB/die so as to remain substantially planar.

The silicon planar substrate substantially matches the TCE of the semiconductor die, thus "bowing" of the die (and PWB) is held to a minimum during temperature extremes. Utilization of "scrap" semiconductor wafers for the silicon planar substrates may be easily accomplished by cutting desired size substrates from the defective silicon wafers. This aids in recycling otherwise unusable semiconductor wafer scrap that is not biodegradable.

The planar substrate may also be made of ceramic, metal or other rigid materials. If the TCE of the planar substrate is different from the semiconductor die, then a compliant adhesive, as mentioned above, may be utilized. The adhesive would electrically insulate the metal planar substrate from the active circuit face of the semiconductor device. Heat transfer would not be significantly affected when an adhesive having good thermal conductivity is used.

According to an aspect of the invention, the planar substrate helps maintain a planar surface of the PPGA or PBGA package and the substrate has a planar face exposed on the PPGA or PBGA package. This planar face may be utilized by automatic assembly pick and place equipment. A vacuum chuck may attach to and pick up the package, then place the package in its proper orientation onto a system printed circuit board. For to a PPGA package, normally a socket or plated through holes are utilized. For a PBGA package, the solder balls of the package are aligned with corresponding solder pads covered with solder flux. The pins of the PPGA package or solder balls of the PBGA package are heated so that solder flows/reflows to make electrical and mechanical connections between the package pins or balls and the system printed circuit board circuit conductors. In addition, the present invention is readily applicable to a PBGA package utilizing conductive epoxy balls as external electrical connections to a system printed circuit board. An epoxy ball grid array package is illustrated in commonly owned U.S. patent application Ser. No. 08/121,678, by Schneider, filed Sep. 15, 1993, and incorporated by reference herein for all purposes.

According to another aspect of the invention, the planar substrate, whether silicon, ceramic or metal, has a planar face exposed on the PPGA or PBGA package. This exposed face may be utilized to remove heat from the active heat generating circuits on the semiconductor die. This heat may be removed by convective air cooling, gas or liquid cooling, or by thermal conduction to an external metal heat sink having greater thermal mass and/or heat dissipating surface area.

According to another embodiment of the present invention, a semiconductor die is attached to the conductors on the face of the PWB by collapsible solder balls wherein the active circuit face of the die is proximate to the face of the PWB. This "flip-chip" arrangement exposes an inactive face of the die which is substantially flat. The peripheral edges of the flip-chip die are encapsulated along with the collapsible solder ball connections and face of the PWB proximate to the periphery of the flip chip die. The inactive face of the die remains exposed after encapsulation, and may be utilized to attach an external heat sink thereto. In addition, pick and place automatic assembly equipment may utilize the exposed planar face of the die. Thus, no additional planar substrate is required for this embodiment.

The present invention is well adapted to the attachment of an external heat sink or other heat conductive means to the exposed face of the planar substrate. The external heat sink may be attached to the exposed face of the planar substrate, but need only be in thermal communication therewith. Thus, heat conductive fingers, group heat sink arrays, etc., may be utilized with an embodiment of the present invention.

A feature of the present invention is the reduction of the amount of encapsulation material necessary to encapsulate the semiconductor die and bond wires. This reduction in encapsulation material substantially prevents the semiconductor die and PWB from warping during the curing of the encapsulation material. Thus, the packages being processed maintain their planarity more easily and more uniformly from one production batch to the next.

Another feature of the present invention is an exposed planar surface for utilization by pick and place automatic assembly equipment and/or ease in efficiently interfacing to heat dissipation systems.

Still another feature of the present invention is an exposed planar surface having good thermal transfer characteristics and being adapted for attachment to an external heat sink.

An advantage of the present invention is the economical production of more uniform and co-planar integrated circuit packages.

Still another advantage of the present invention is a reduction in the amount of encapsulation material required to seal a semiconductor die and the associated bond wires in PPGA and PBGA packages.

Another advantage is the recycling of otherwise scrap silicon semiconductor wafers. Other objects, features and advantages of the invention will become apparent in light of the following description thereof when taken in combination with the drawings.

DETAILED DESCRIPTION OF THE INVENTION

Figure 1A:
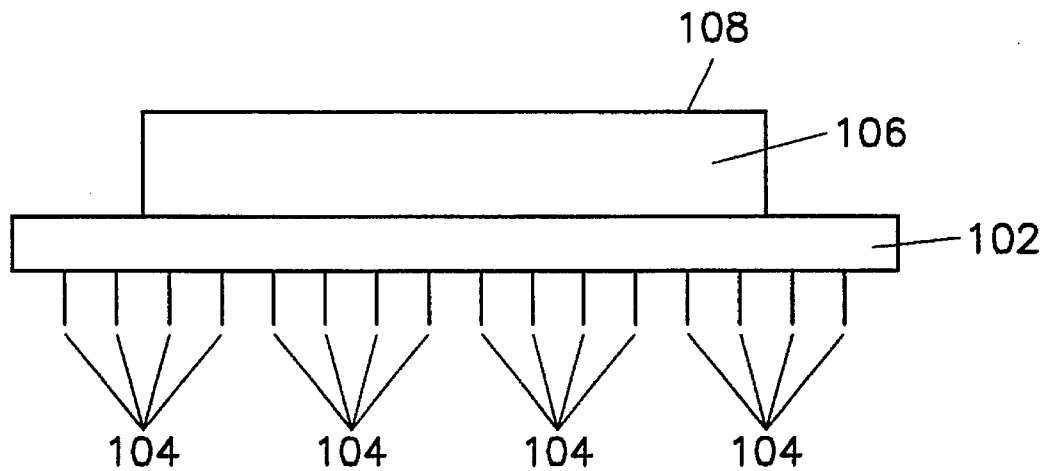
FIG. 1A is a schematic elevational view of a prior art Plastic Pin Grid Array integrated circuit package.
Figure 1B:
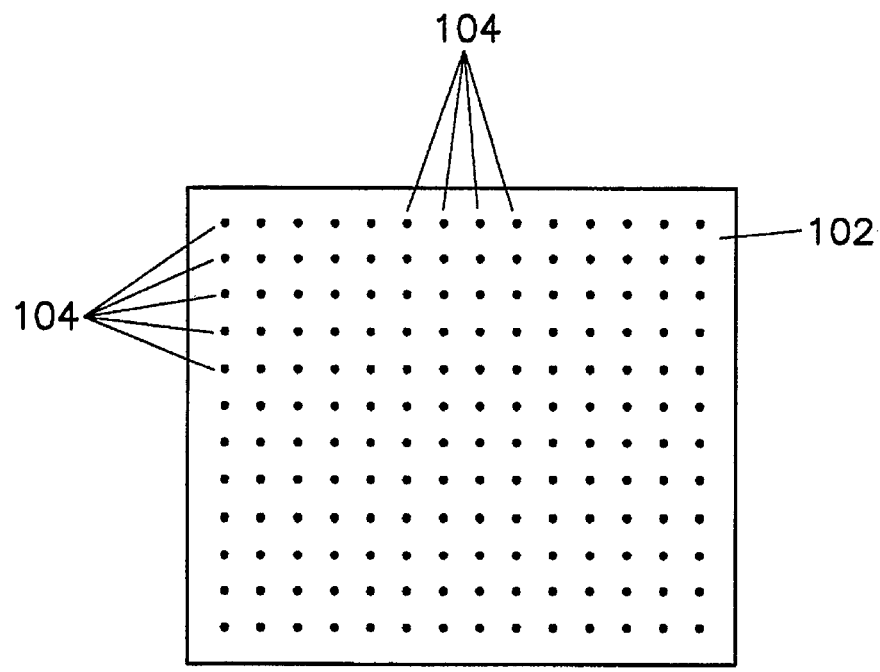
FIG. 1B is a schematic plan view of the bottom of the package illustrated in FIG. 1A.

FIGS. 1A and 1B illustrate a prior art plastic pin grid array (PPGA) integrated circuit package. The PPGA package of FIGS. 1A and 1B is comprised of a printed wiring board (PWB) 102, external connection pins 104, encapsulation 106, and lid 108. The pins 104 may be mechanically connected to a system printed circuit board socket or soldered to plated through holes in the printed circuit board. The PWB 102 has conductive traces (not illustrated) that connect the pins 104 to the electrical circuits on a semiconductor die (not illustrated) housed inside of the encapsulation 106. The lid 108 covers the top of the encapsulation 106, and may be utilized as a planar surface for pick and place automatic assembly equipment.

Figure 2A:
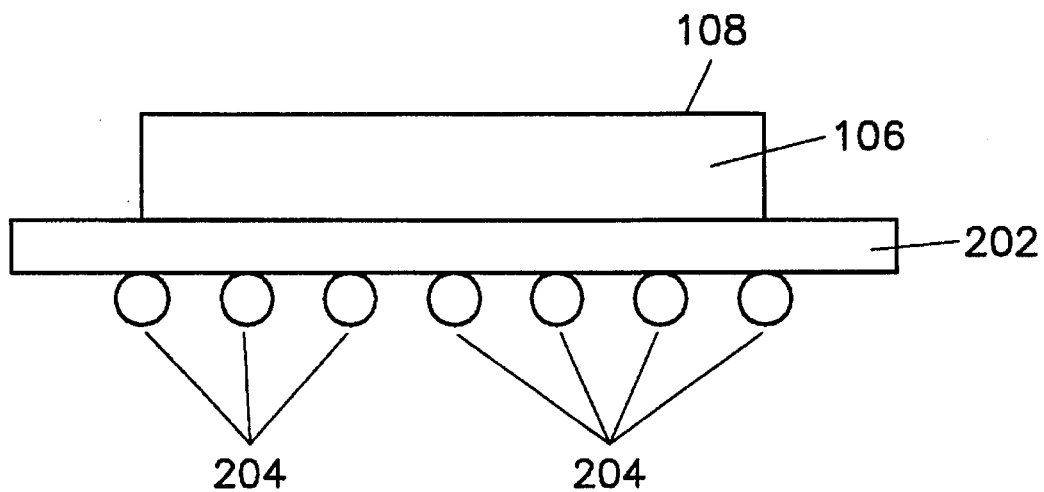
FIG. 2A is a schematic elevational view of a prior art Plastic Ball Grid Array integrated circuit package.
Figure 2B:
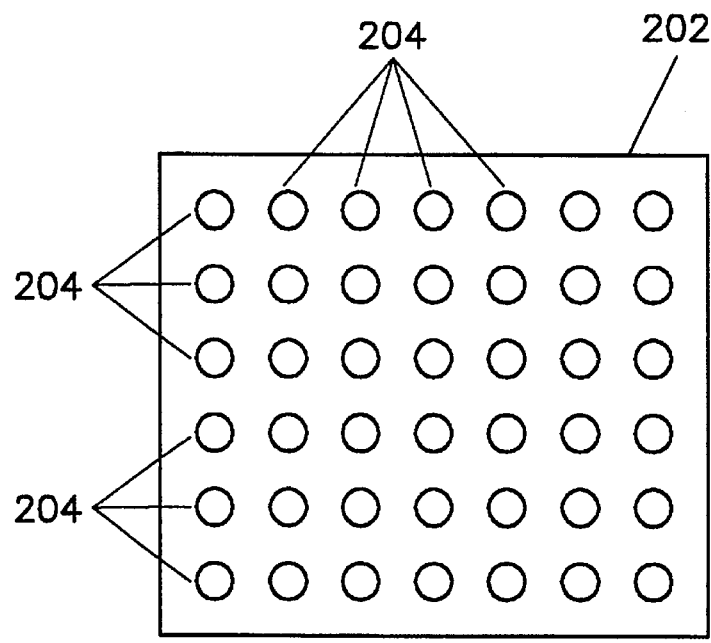
FIG. 2B is a schematic plan view of the bottom of the package illustrated in FIG. 2A.

FIGS. 2A and 2B illustrate a prior art plastic ball grid array (PBGA) integrated circuit package. The PBGA package of FIGS. 2A and 2B is comprised of a printed wiring board (PWB) 202, external connection solder balls 204, encapsulation 106, and lid 108. The solder balls 204 are aligned with corresponding solder flux covered connection pads on a system printed circuit board, and when heated together, the solder balls 204 reflow to the connection pads on the printed circuit board (not illustrated).

The PWB 202 has conductive traces (not illustrated) that connect the solder balls 204 to the electrical circuits on a semiconductor die (not illustrated) housed inside of the encapsulation 106. The lid 108 covers the top of the encapsulation 106, and may be utilized as a planar surface for pick and place automatic assembly equipment. The only significant difference between the PPGA and PBGA packages is the external connection pins and solder balls, respectively.

Figure 3:
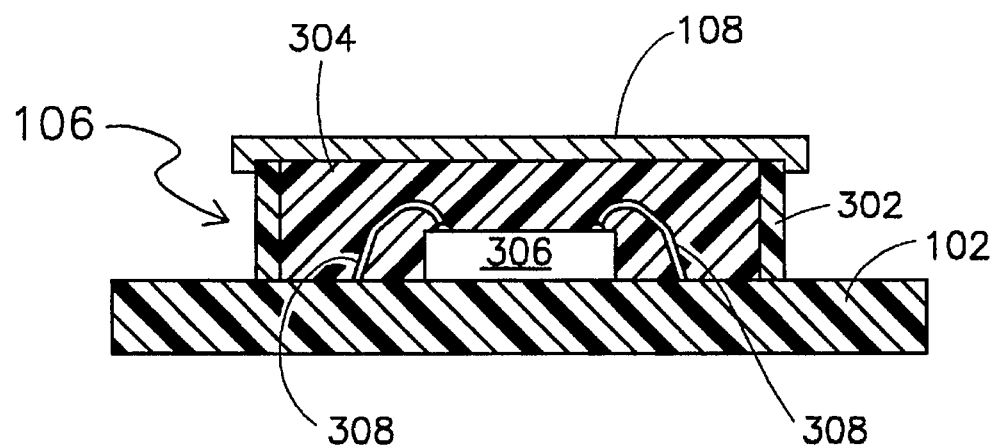
FIG. 3 is a schematic elevation sectional view of the packages of FIGS. 1A and 2A.

Referring now to FIG. 3, a schematic elevation sectional view of the prior art packages of FIGS. 1A and 2A is illustrated. The pins 104 of FIG. 1A or solder balls 204 of FIG. 2A are not illustrated for simplification and clarity. The encapsulation 106 is comprised of a dam ring 302 which holds encapsulation material 304 around a semiconductor die 306 and bond wires 308. The encapsulation material may be "HYSOL" or any other type of encapsulation material known to those skilled in the art of semiconductor packaging.

During fabrication of the integrated circuit package, the semiconductor die is electrically connected to conductive traces (not illustrated) on the PWB 102 by means of the bond wires 308. The encapsulation material 304 entirely covers the semiconductor die 306, bond wires 308, and part of the surface of PWB 102. The encapsulation material 304 is poured in a liquid form over the die 306 and the bond wires 308, then the encapsulation material is cured from a liquid to a solid.

The encapsulation material 304 may shrink while curing. The encapsulation material 304 attaches to the surface of the PWB 102, and if the material 304 shrinks, then the PWB 102 may tend to bow. Bowing is undesirable because the lid 108 will not fit properly over the encapsulation material, or if the lid is placed on the dam ring 302 before the encapsulation material 304 cures, the lid 108 may also bow and lose its planarity. If the lid 108 loses its planarity, then the package may not be suitable for automatic pick and place assembly.

What is needed is a new, novel and non-obvious method and apparatus that produces inexpensive, reliable and easy to manufacture PPGA and PBGA packages without the problem of package warping during encapsulation curing.

Figure 4:
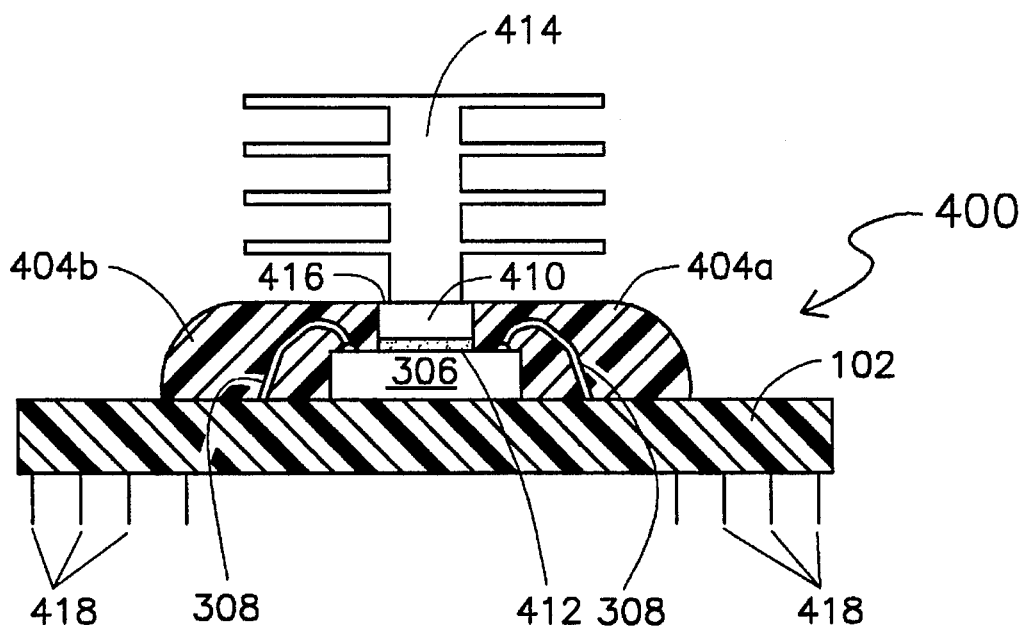
FIG. 4 is a schematic elevation sectional view of a preferred embodiment of the present invention.

Referring now to FIG. 4, a preferred embodiment of the present invention is illustrated in a schematic elevation sectional view. The integrated circuit package, generally represented by the numeral 400, is comprised of the PWB 102, the semiconductor die 306 connected to conductive lands (not illustrated) on the PWB 102 by bond wires 308 metal pins 418 connect to the conductive lands, a planar substrate 410 is attached to the semiconductor die 306 by adhesive 412, and encapsulation materials 404a and 404b covers the bondwires 308, and connections to the die 306 and PWB 102. Optionally, external heat sink 414 may be attached to and in thermal communication with an exterior planar face 416 of the planar substrate 410.

Figure 5A:
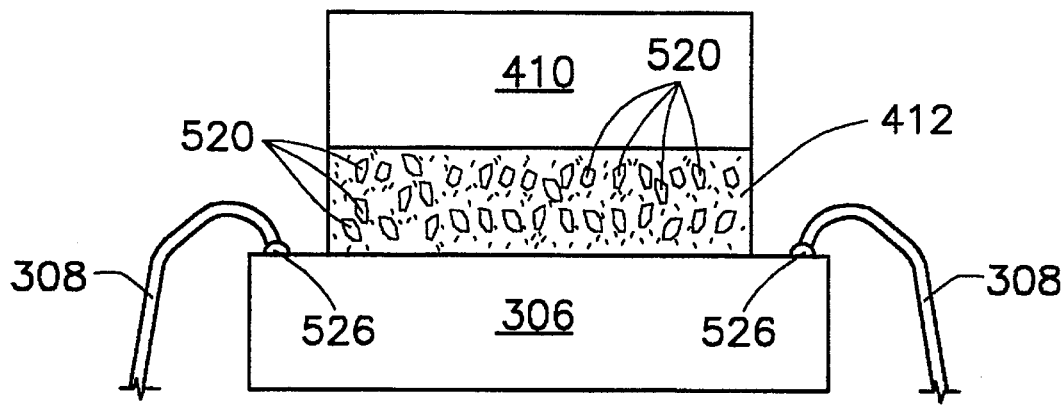
FIGS. 5A and 5B are more detailed partial schematic elevational views of the invention of FIG. 4.
Figure 5B:
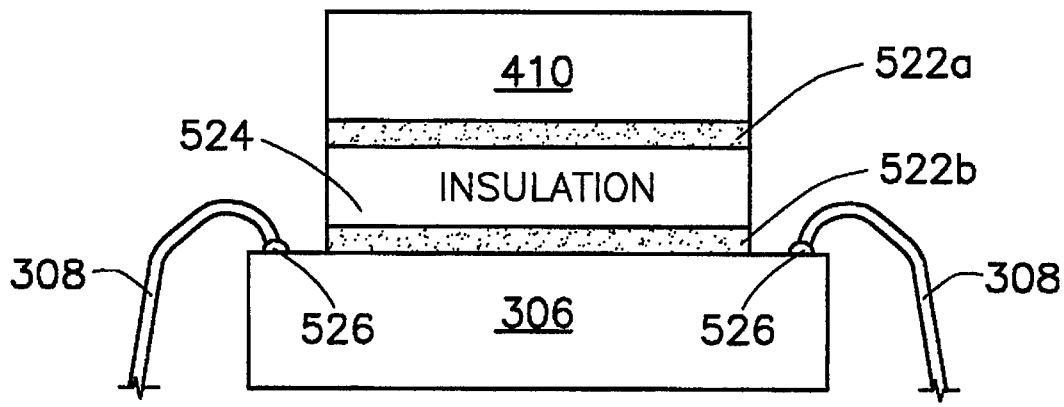

Referring now to FIGS. 5A and 5B, more detailed partial schematic elevational views of preferred embodiments of the present invention are illustrated. The adhesive 412 may be filled with fused quartz (silica) particles 520 for improved thermal conductivity. The fused quartz particles 520 allow a thicker adhesive 412 to still be thermally conductive while remaining an electrical insulator. Thus, a thin or thick layer of adhesive 412 may be utilized without substantial degradation of heat transfer from the die 306 to the substrate 410.

The planar substrate 410 may be made of silicon, ceramic, metal or other materials having relative stiffness. Preferably, the planar substrate 410 will have substantially the same TCE as the die 306 so that over a large temperature range, the possibility of the planar substrate 410 causing the die 306 to warp is minimized. When the TCE of the planar substrate 410 and die 306 are sufficiently different, a compliant adhesive may be utilized.

Most preferably, the planar substrate 410 may be composed of silicon, the same material as the die 306. A ready source of silicon planar substrates is from defective silicon wafers that did not pass fabrication testing. Normally these defective silicon wafers are thrown away as scrap, but the present invention may utilize these defective wafers by cutting them up as required for the planar substrates 410. The planar substrate 410 and die 306 may also be attached together with an insulator 524 having adhesives 522a and 522b on its faces. The insulator 524 may be, for example, a thin layer of polyimide. The adhesives 522a and 522b may be B-staged epoxy.

The bond wires 308 are attached to bond pads 526 on the active face of the semiconductor die 306. The other ends of the bond wires 308 are attached to conductive lands (not illustrated) on the PWB 102, as is well known to those skilled in the art of semiconductor package fabrication. Other methods for connecting a semiconductor device to a PWB are equally well known to those skilled in the art of semiconductor packaging, such as, for example, TAB, thermal compression bonding (internal leadframe), ball bonding, collapsible solder ball flip-chips, etc. It is the intent of the present invention to include and encompass any means or method of making electrical connections between a semiconductor die and a substrate having conductive lands thereon that further connect to external connection means such as, for example, pins or solder balls (PPGA or PBGA, respectively).

Figure 6:
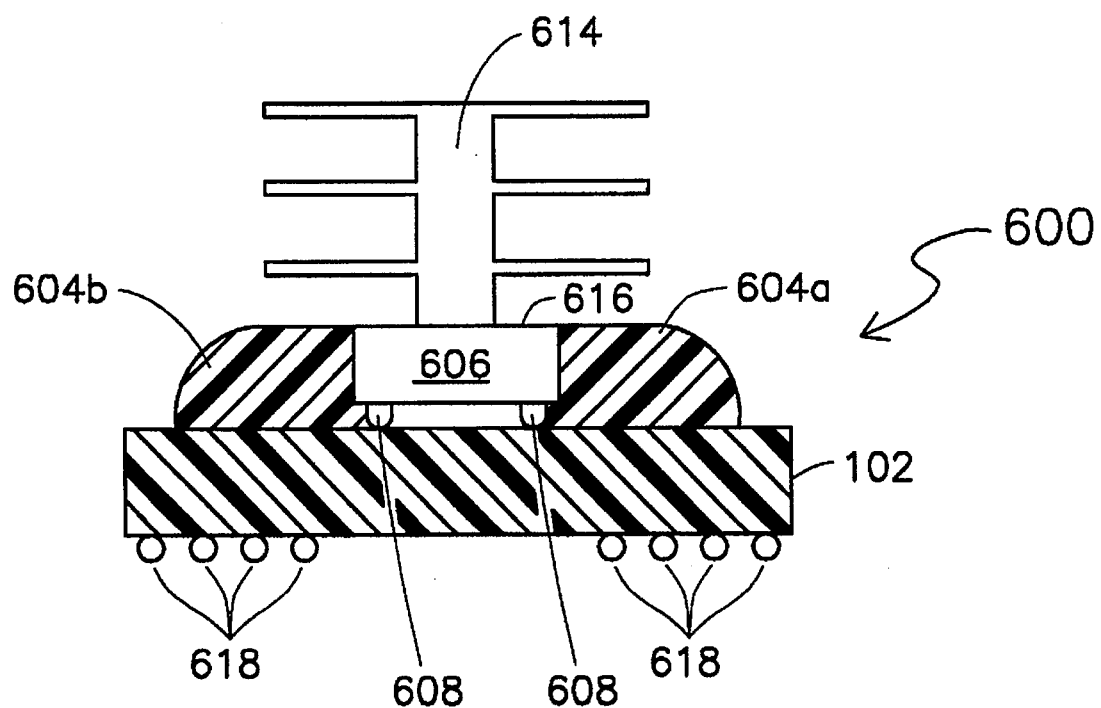
FIG. 6 is a schematic elevational view of another embodiment of the present invention.

Referring to FIG. 6, another preferred embodiment of the present invention is illustrated in schematic elevational view. The integrated circuit package, generally represented by the numeral 600, is comprised of the PWB 102, a flip-chip semiconductor die 606, collapsible solder balls 608 which connect the electrical circuits of the die 606 to conductive lands (not illustrated) on the PWB 102, solder balls 618 connect to the conductive land (conductive epoxy may be used in place of the solder balls with equally good results), and encapsulation materials 604a and 604b. Optionally, an external heat sink 614 may be attached to and in thermal communication with an exterior planar face 616 of the flip-chip die 606. The conductive lands of the PWB 102 connect to external connection means (not illustrated for clarity) as mentioned above.

The present invention introduces a new system and method of reducing the possibility of warpage in the fabrication of semiconductor integrated circuit packages, and reduces the cost and complexity of fabricating the semiconductor packages. In addition, a planar exterior surface facilitates the use of automatic pick and place assembly machines, and further provides an advantageous place to attach an external heat sink for improved thermal performance.

The present invention, therefore, is well adapted to carry out the objects and attain the ends and advantages mentioned, as well as others inherent therein. While presently preferred embodiments of the invention have been given for purposes of disclosure, numerous changes in the details of construction, interconnection and arrangement of parts will readily suggest themselves to those skilled in the art, and which are encompassed within the spirit of the invention and the scope of the appended claims.

What is claimed is:

1. An integrated circuit package, comprising:

a printed wiring board having external connections for connection to an external system printed circuit board and internal connection pads connected to the external connections;

a semiconductor device having bond pads inside and near peripheral edges of said semiconductor device and connected to internal circuits of said semiconductor device, the bond pads connected to said printed wiring board internal connection pads;

a planar substrate attached to a face of said semiconductor device and within the perimeter of the bond pads with an insulating adhesive, said planar substrate having substantially the same thermal coefficient of expansion as said semiconductor device; and encapsulation material covering the peripheral edges of said planar substrate, exposed surfaces of said semiconductor device, bond pads on said semiconductor device, and internal connection pads on said printed wiring board, wherein an outer face of said planar substrate remains exposed.

2. The package of claim 1, wherein the external connections of said printed wiring board are metal pins.

3. The package of claim 1, wherein the external connections of said printed wiring board are solder balls.

4. The package of claim 1, wherein the external connections of said printed wiring board are conductive epoxy.

5. The package of claim 1, wherein the bond pads of said semiconductor device are connected to the internal connection pads of said printed wiring board by wire bonding.

6. The package of claim 1, wherein the bond pads of said semiconductor device are connected to the internal connection pads of said primed wiring board by tape automated bonding.

7. The package of claim 1, wherein the bond pads of said semiconductor device are connected to the internal connection pads of said printed wiring board by collapsible solder balls.

8. The package of claim 1, wherein said planar substrate is comprised of silicon.

9. The package of claim 1, wherein said planar substrate is attached to the face of said semiconductor device with encapsulation material.

10. The package of claim 1, wherein said planar substrate is attached to the face of said semiconductor device with an adhesive.

11. The package of claim 1, further comprising a heat sink proximate to and in thermal communication with the exposed outer face of said planar substrate.

12. The package of claim 1, further comprising an insulator with adhesive on both faces of said insulator, said insulator between said semiconductor device and said planar substrate.

13. The package of claim 1, wherein said planar substrate is comprised of metal.

14. The package of claim 1, wherein said planar substrate has substantially the same temperature coefficient of expansion as said semiconductor device.

15. The package of claim 8, wherein the silicon planar substrate is a semiconductor wafer.

16. The package of claim 9, wherein the encapsulation material is epoxy.

17. The package of claim 10, wherein the adhesive is compliant.

18. The package of claim 10, wherein the adhesive is compliant.

19. The package of claim 12, wherein said insulator is polyimide.

20. The package of claim 13, wherein the metal planar substrate is aluminum.

21. The package of claim 13, wherein the metal planar substrate is copper.

22. The package of claim 17, wherein the thermally conductive adhesive is filled with fused quartz (silica) particles.

23. An integrated circuit package, comprising:

a printed wiring board having external connections for connection to an external system printed circuit board and internal connection pads connected to the external connections;

a semiconductor device having bond pads inside and near peripheral edges of said semiconductor device and connected to internal circuits of said semiconductor device, the bond pads connected to said printed wiring board internal connection pads;

an insulator attached to a face of said semiconductor device a planar substrate attached to said insulator, said insulator between said semiconductor device and said planar substrate and said planar substrate within the perimeter of the bond pads;

a heat sink proximate to and in thermal communication with said planar substrate; and encapsulation material covering the peripheral edges of said planar substrate, exposed surfaces of said semiconductor device, bond pads on said semiconductor device, and internal connection pads on said printed wiring board.

24. The package of claim 23, wherein said planar substrate is comprised of metal.

25. The package of claim 24, wherein the metal planar substrate is aluminum.

26. The package of claim 24, wherein the metal planar substrate is cooper.

* * * * *

UNITED STATES PATENT AND TRADEMARK OFFICE
CERTIFICATE OF CORRECTION

PATENT NO. : 5,610,442
DATED : March 11, 1997
INVENTOR(S) : Schneider et al.

It is certified that error appears in the above-identified patent and that said Letters Patent is hereby corrected as shown below:

Column 7,
Line 35, "coveting" should be -- covering --
Line 52, "primed" should be -- printed --

Column 8,
Line 20, "compliant" should be -- thermally conductive --
Line 60, "cooper" should be -- copper --

Signed and Sealed this

Sixth Day of July, 2004

JON W. DUDAS
*Acting Director of the United States Patent and Trademark Office*